United States Patent
Choi et al.

(10) Patent No.: US 9,667,247 B2
(45) Date of Patent: May 30, 2017

(54) RADIO FREQUENCY SWITCH

(71) Applicant: SAMSUNG ELECTRO-MECHANICS CO., LTD., Suwon-si (KR)

(72) Inventors: Jae Hyouck Choi, Suwon-si (KR); Jeong Hoon Kim, Suwon-si (KR); Kyu Jin Choi, Suwon-si (KR); Suk Chan Kang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/984,195

(22) Filed: Dec. 30, 2015

(65) Prior Publication Data

US 2016/0197607 A1    Jul. 7, 2016

(30) Foreign Application Priority Data

Jan. 7, 2015    (KR) .................. 10-2015-0001771

(51) Int. Cl.
  *H04B 7/14*    (2006.01)
  *H03K 17/693*    (2006.01)
  *H04B 1/44*    (2006.01)

(52) U.S. Cl.
  CPC ........... *H03K 17/693* (2013.01); *H04B 1/44* (2013.01)

(58) Field of Classification Search
  CPC .................... H04B 1/006; H04B 1/0057
  USPC .......... 455/20, 552.1, 63.3, 118, 131, 190.1
  See application file for complete search history.

(56) References Cited

U.S. PATENT DOCUMENTS

| | | | | |
|---|---|---|---|---|
| 7,546,089 | B2* | 6/2009 | Bellantoni | ............... H01P 5/04 333/101 |
| 9,124,265 | B2* | 9/2015 | Dykstra | ............... H03K 17/005 |
| 2009/0181630 | A1* | 7/2009 | Seshita | ................. H04B 1/006 455/191.3 |
| 2011/0140764 | A1 | 6/2011 | Shin et al. | |
| 2016/0049931 | A1* | 2/2016 | Na | ...................... H03K 17/687 327/436 |

FOREIGN PATENT DOCUMENTS

| | | |
|---|---|---|
| KR | 10-2011-0068584 A | 6/2011 |
| KR | 10-2013-0088019 A | 8/2013 |
| KR | 10-2014-0086487 A | 7/2014 |
| WO | WO 2011/149596 A1 | 1/2011 |

* cited by examiner

*Primary Examiner* — Sonny Trinh
(74) *Attorney, Agent, or Firm* — NSIP Law

(57) ABSTRACT

An radio frequency switch according to an example includes a first switching circuit including first switching elements connected in series between an antenna port and a transmission port and operated by a first gate signal, a second switching circuit including second switching elements connected in series between the antenna port and a reception port and operated by a second gate signal, a first shunt circuit connected between the transmission port and a ground and operated by the second gate signal, a second shunt circuit connected between the reception port and the ground and operated by the first gate signal, and a third shunt circuit connected between the reception port and the other end of an inductor grounded at one end and operated by the second gate signal.

16 Claims, 7 Drawing Sheets

RADIO FREQUENCY SWITCH

CROSS-REFERENCE TO RELATED APPLICATION(S)

This application claims the benefit under 35 USC 119(a) of Korean Patent Application No. 10-2015-0001771 filed on Jan. 7, 2015 in the Korean Intellectual Property Office, the entire disclosure of which is incorporated herein by reference.

BACKGROUND

1. Field

The following description relates to a radio frequency switch.

2. Description of Related Art

With advancements in wireless communications technology, various communications standards are being simultaneously used. Also, as wireless communications modules become more compact and portable terminals increasingly become highly efficient, it is required that a plurality of communications standards be implemented in a single portable terminal. Thus, a quantity of frequency bands supported in a single mobile phone or another mobile electronic device has increased.

Along with such a tendency, various frequency bands are designed to be supported in radio frequency (RF) front-end fields. For example, a radio frequency switch positioned in a signal path between an antenna and an RF chipset is designed to support various frequency bands.

Such a radio frequency switch minimizes insertion loss in order to reduce power consumption and preserve lifespan of a battery and also have excellent isolation properties, in order to minimize interference between various frequency bands in a transmission and reception path.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples provide a radio frequency switch creating low insertion loss and having excellent isolation characteristics by employing shunt series switching units operating as a notch filter or a band pass filter.

In one general aspect, a radio frequency switch includes a first switching circuit including first switching elements connected in series between an antenna port and a transmission port and operated by a first gate signal, a second switching circuit including second switching elements connected in series between the antenna port and a reception port and operated by a second gate signal, a first shunt circuit connected between the transmission port and a ground and operated by the second gate signal, a second shunt circuit connected between the reception port and the ground and operated by the first gate signal, and a third shunt circuit connected between the reception port and the other end of an inductor grounded at one end and operated by the second gate signal.

In response to the first gate signal being a high level signal, the second gate signal may be a low level signal, and in response to the first gate signal being a low level signal, the second gate signal may be a high level signal.

In response to the first switching circuit forming a transmission path, the second shunt circuit may transfer a signal from the reception port to the ground.

In response to the second switching circuit forming a reception path, the first shunt circuit may transfer a signal from the transmission port to the ground.

The first shunt circuit and the second shunt circuit may include third switching elements and fourth switching elements, respectively.

The third shunt circuit may include fifth switching elements.

In response to the first switching circuit forming a transmission path, the third shunt circuit may operate as a capacitor to form a notch filter with the inductor.

In response to the second switching circuit forming a reception path, the second shunt circuit may operate as a capacitor to form a band pass filter with the inductor.

Each of the switching elements of the first to fifth switching elements may be an N-channel field effect transistor (FET) or a P-channel FET.

The radio frequency switch may further include an amplifying circuit connected to the transmission port and configured to output an amplified transmission signal.

In another general aspect, a radio frequency switch includes a transmission port configured to receive a first radio frequency signal, a reception port configured to output a second radio frequency signal, an antenna port configured to transmit the first radio frequency signal or receive the second radio frequency signal, a first switching circuit including first switching elements connected to each other in series that form a path for the first radio frequency signal between the transmission port and the antenna port or that cut off the path, a second switching circuit including second switching elements connected to each other in series that form a path of the second radio frequency signal between the reception port and the antenna port or that cut off the path, a first shunt circuit including third switching elements connected to each other in series, and connected between the transmission port and the ground, a second shunt circuit including fourth switching elements connected to each other in series, and connected between the reception port and the ground, and a third shunt circuit located between the reception port and the other end of an inductor grounded at one end, and including fifth switching elements connected to each other in series.

In response to the first switching circuit forming a path of the first radio frequency signal, the second shunt circuit may form a first bypass path from the reception port to the ground.

In response to the second switching circuit forming a path of the second radio frequency signal, the first shunt circuit may form a second bypass path from the transmission port to the ground.

In response to the first switching circuit forming the path of the first radio frequency signal, the fifth switching elements may operate as capacitors to form a notch filter with the inductor.

In response to the second switching circuit forming the path of the second radio frequency signal, the fourth switching elements may operate as capacitors to form a band pass filter with the inductor.

The radio frequency switch may further include a band pass filter connected to the antenna port and configured to cancel interference of a band signal adjacent to the first radio frequency signal or the second radio frequency signal.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, are described in detail with reference to the accompanying drawings.

Figure 1:
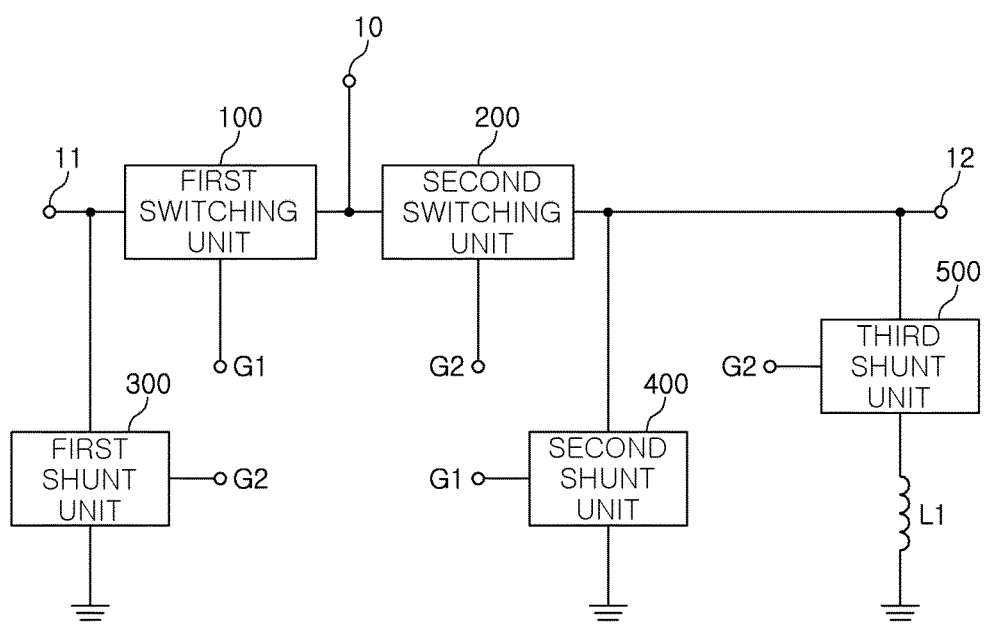
FIG. 1 is a block diagram illustrating a radio frequency switch according to an example.

FIG. 1 is a block diagram illustrating a radio frequency switch according to an example.

Referring to the example of FIG. 1, a radio frequency switch according to an example includes a first switching unit 100, a second switching unit 200, a first shunt unit 300, a second shunt unit 400, and a third shunt unit 500.

In this example, the first switching unit 100 is positioned between an antenna port 10 and a transmission port 11, and is operated by a first gate signal G1.

In further detail, in this example, the first switching unit 100 is connected between the antenna port 10 and the transmission port 11 and electrically connects or cuts off a signal transmission path between the antenna port 10 and the transmission port 11.

The second switching unit 200 is positioned between the antenna port 10 and a reception port 12 is operated by a second gate signal G2.

In further detail, in this example, the second switching unit 200 is connected between the antenna port 10 and the reception port 12 and electrically connects or cuts off a signal transmission path between the antenna port 10 and the reception port 12.

The first shunt unit 300 is connected between the transmission port 11 and a ground and electrically connects or cuts off a signal transmission path between the transmission port 11 and the ground.

In this example, the first shunt unit 300 is operated by the second gate signal G2.

The second shunt unit 400 is connected between the reception port 12 and the ground and electrically connects or cuts off a signal transmission path between the reception port 12 and the ground.

In this example, the second shunt unit 400 is operated by the first gate signal G1.

The third shunt unit 500 is connected between the reception port 12 and the other end of an inductor L1 grounded at one end and controlled by the second gate signal G2 to perform a switching operation.

Figure 2:
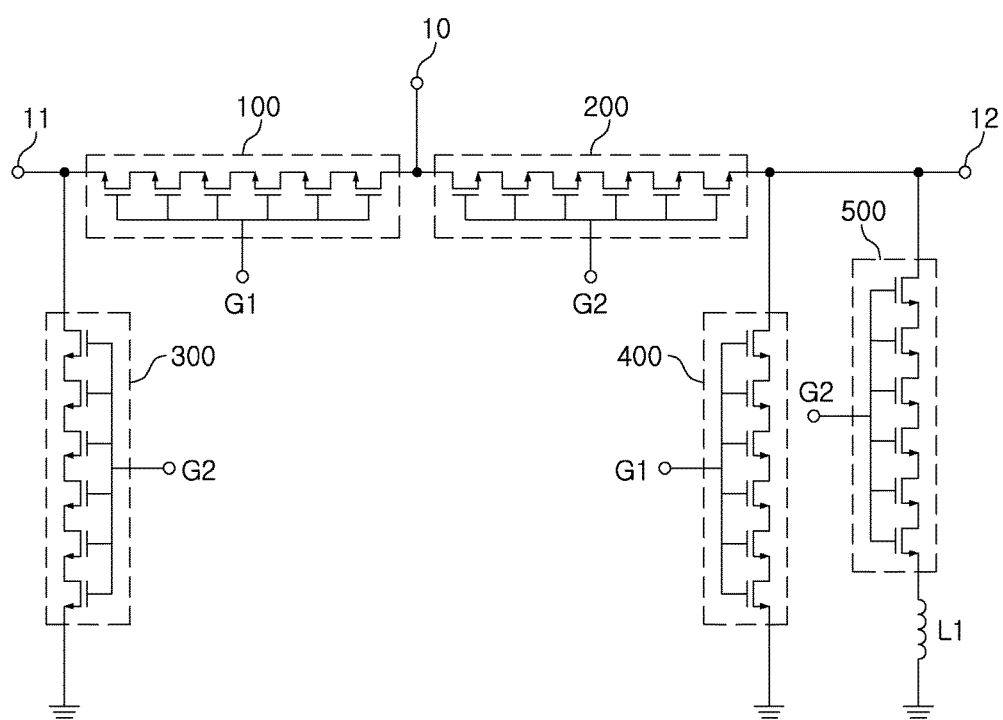
FIG. 2 is a circuit diagram illustrating a radio frequency switch according to an example.

FIG. 2 is a circuit diagram illustrating a radio frequency switch according to an example.

Referring to the example of FIG. 2, a radio frequency switch according to an example includes a first switching unit 100 including a plurality of first switching elements, a second switching unit 200 including a plurality of second switching elements, a first shunt unit 300 including a plurality of third switching elements, a second shunt unit 400 including a plurality of fourth switching elements, a third shunt unit 500 including a plurality of fifth switching elements, and an inductor L1.

For example, the first switching elements, the second switching elements, the third switching elements, the fourth switching elements, and the fifth switching elements include at least one of a field effect transistor (FET) and a bipolar junction transistor (BJT). These two types of transistor use different structures to provide switching functionality. A field effect transistor is a transistor that uses an electric field to control the shape and hence the electrical conductivity of a channel of one type of charge carrier in a semiconductor material. A bipolar junction transistor is a type of transistor that uses both electron and hole charge carriers.

That is, in various examples, the first switching unit 100, the second switching unit 200, the first shunt unit 300, the second shunt unit 400, and the third shunt unit 500 include at least one of a plurality of FETs and a plurality of BJTs. In the plurality of FETs, sources and drains are connected in series, and either the first gate signal G1 or the second gate signal G2 is applied to the gates. In the plurality of BJTs, emitters and collectors are connected in series, and either the first gate signal G1 or the second gate signal G2 is applied to bases.

In this example, as illustrated in the example of FIG. 2, the first gate signal G1 is applied to the first switching unit 100, the second gate signal G2 is applied to the second switching unit 200, the second gate signal G2 is applied to the first shunt unit 300, the first gate signal G1 is applied to the second shunt unit 400, and the second gate signal G2 is applied to the third shunt unit 500.

In FIG. 2, FETs are illustrated as a plurality of switching elements included in the first and second switching units 100 and 200 and the first to third shunt units 300, 400, and 500. However, the type of the switching elements is not limited to FETs, and the aforementioned BJTs are also optionally included as transistors to provide the switching capability for the elements of FIG. 2.

Also, in the example of FIG. 2, the FETs of the plurality of FETs are illustrated as N channel FETs, but P channel FETs, as well as the N channel FETs, are potentially included in other example, and in a case in which BJTs are used as switching elements of the plurality of switching elements, both NPN BJTs and PNP BJTs are potentially used as candidate types of switching elements.

In the example of FIG. 2, the plurality of switching elements is illustrated as including six FETs, but FIG. 2 is merely illustrative, and the number of the switching elements is not limited thereto. That is, in various examples, different numbers of switching elements are included, as long as there are two or more switching elements present.

Subsequently, for the purposes of description, it is assumed that the first and second switching units 100 and 200 and the first to third shunt units 300, 400, and 500 include N channel FETs as the switching elements in the plurality of switching elements. However, other examples implement similar functionality in similar ways, as discussed above.

In the radio frequency switch according to an example, the antenna port 10 is connected to the transmission port 11 and the reception port 12.

As illustrated, one of the ends of each of the first switching unit 100 and the second switching unit 200 are commonly connected to the antenna port 10, the other end of the first switching unit 100 is connected to the transmission port 11, and the other end of the second switching unit 200 is connected to the reception port 12.

In this example, the antenna port 10 is connected to an appropriate antenna for transmitting or receiving a radio frequency signal.

The first switching unit 100 transfers a radio frequency signal received from the transmission port 11 into the antenna port 10 in order to transmit the radio frequency signal through the antenna.

Hereinafter, a radio frequency signal transferred between the transmission port 11 and the antenna port 10 is referred to as a first radio frequency signal.

The second switching unit 200 transfers the radio frequency signal received from the antenna port 10 through the antenna into the reception port 11 in order to externally output the radio frequency signal from the reception port 11.

Hereinafter, the radio frequency signal transferred between the reception port 12 and the antenna port 10 is referred to as a second radio frequency signal.

The first shunt unit 300 and the second shunt unit 400 are located between the transmission port 11 and the ground and between the reception port 12 and the ground, respectively, and are switched according to the first and second gate signals G1 and G2 in order to bypass a residual signal of the first switching unit 100 and the second switching unit 200 to the grounds, respectively.

In other words, in a scenario in which the first switching unit 100 forms a path of the first radio frequency signal, the second shunt unit 400 forms a first bypass path from the reception port 12 to the ground, and in a scenario in which the second switching unit 200 forms a path of the second radio frequency signal, the first shunt unit 300 forms a second bypass path from the transmission port 11 to the ground.

The third shunt unit 500 is located between the reception port 12 and the other end of the inductor L1, and is grounded at one end and switched according to the second gate signal G2 so as to operate as a capacitor or a resistor.

Figure 3:
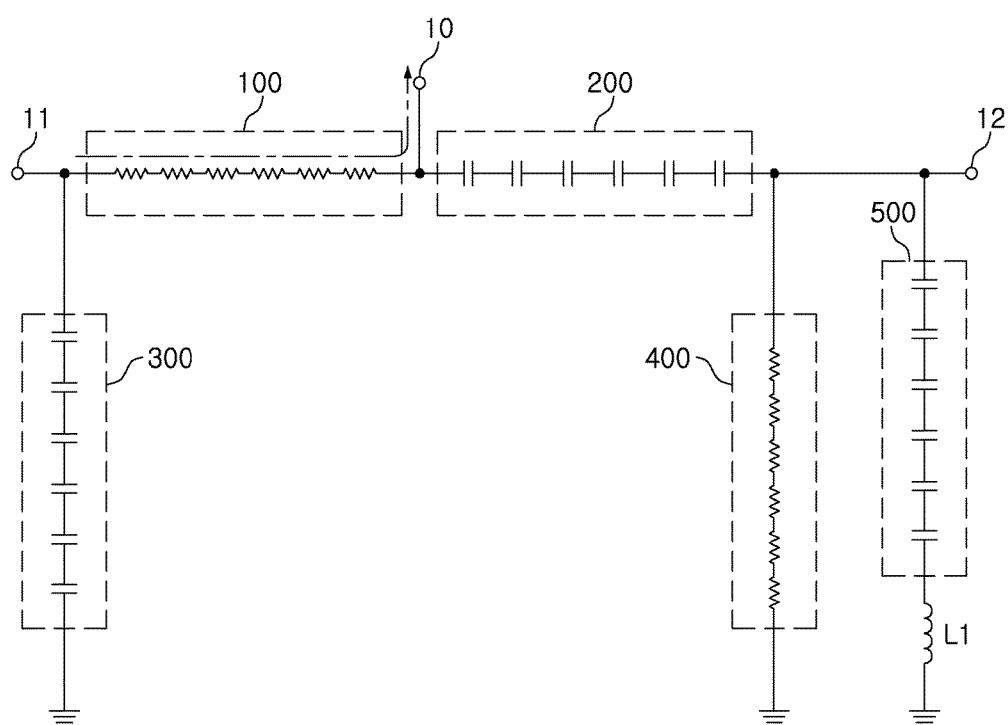
FIG. 3 is an equivalent circuit diagram illustrating a radio frequency switch in a transmission mode according to an example.

FIG. 3 is an equivalent circuit diagram illustrating a radio frequency switch in a transmission mode according to an example.

An operation of the radio frequency switch in a transmission mode is described further with reference to FIGS. 2 and 3.

In the example of FIG. 3, the first switching unit 100 performs a switching operation in a similar manner to that of the second shunt unit 400, and the second switching unit 200 performs a switching operation in a similar manner to those of the first shunt unit 300 and the third shunt unit 500.

That is, the first switching unit 100 and the second shunt unit 400 perform a switching operation according to the first gate signal G1, and the second switching unit 200, the first shunt unit 300, and the third shunt unit 500 perform a switching operation according to the second gate signal G2.

In such an example, the first gate signal applied to the first switching unit 100 and the second shunt unit 400 is a high level signal, and the second gate signal applied to the second switching unit 200, the first shunt unit 300, and the third shunt unit 500 is a low level signal.

In such a scenario, the first switching unit 100 is turned on to electrically connect the transmission port 11 and the antenna port 10, and the second switching unit 200 is turned off to disconnect the reception port 12 and the antenna port 10.

Also, in this scenario, the first shunt unit 300 is turned off to disconnect the transmission port 11 and the ground, the second shunt unit 400 is turned on to electrically connect the reception port 12 and the ground, and the third shunt unit 500 is turned off to operate as a capacitor.

Thus, the first switching unit 100 forms a transmission path and the second shunt unit 400 transfers a residual signal from the reception port 12 to the ground.

In this scenario, the third shunt unit 500 operates as a capacitor to form a notch filter with the inductor L1.

Thus, because the first switching unit 100 is turned on, a first radio frequency signal is smoothly transferred between the transmission port 11 and the antenna port 10, and because the second switching unit 200 and the first shunt unit 300 are turned off, an unnecessary flow of the first radio frequency signal is accordingly cut off.

Also, because the second shunt unit 400 between the reception port 12 and the ground is turned on, the first radio frequency signal is prevented from being transferred to the reception port 12. Furthermore, because the inductor L1 forms a notch filter with the third shunt unit 500 in an ON state, as a result, insertion loss, isolation characteristics, and band noise characteristics of a receiver (Rx band noise) are accordingly improved.

Figure 4:
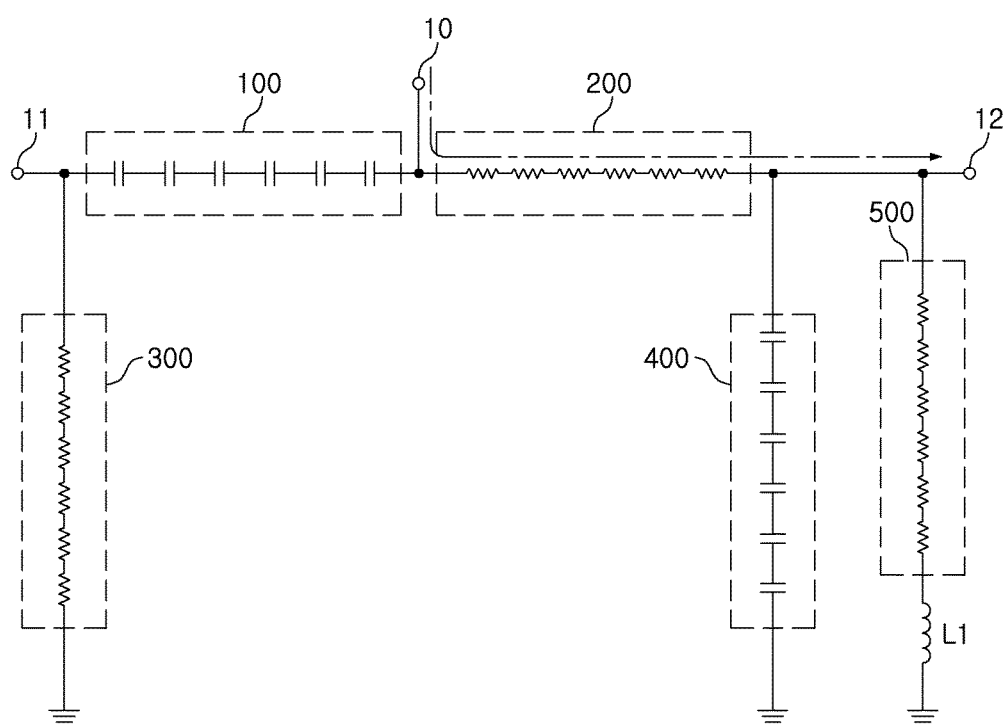
FIG. 4 is an equivalent circuit diagram illustrating a radio frequency switch in a reception mode according to an example.

FIG. 4 is an equivalent circuit diagram illustrating a radio frequency switch in a reception mode according to an example.

Hereinafter, an operation of the radio frequency switch in a transmission mode is described further with reference to FIGS. 2 and 4.

In the example of FIG. 4, the first switching unit 100 performs a switching operation in the same manner as that of the second shunt unit 400, and the second switching unit 200 performs a switching operation in the same manner as those of the first shunt unit 300 and the third shunt unit 500.

Thus, the first switching unit 100 and the second shunt unit 400 perform a switching operation according to the first gate signal G1, while the second switching unit 200, the first shunt unit 300, and the third shunt unit 500 perform a switching operation according to the second gate signal G2.

In such an example, the first gate signal applied to the first switching unit 100 and the second shunt unit 400 is a high level signal, and the second gate signal applied to the second switching unit 200, the first shunt unit 300, and the third shunt unit 500 is a low level signal.

In such a scenario, the first switching unit 100 is turned off to disconnect the transmission port 11 and the antenna port 10, and the second switching unit 200 is turned on to electrically connect the reception port 12 and the antenna port 10.

Also, in this example, the first shunt unit 300 is turned on to electrically connect the transmission port 11 and the ground, the second shunt unit 400 is turned off to disconnect the reception port 12 and the ground, and the third shunt unit 500 is turned on so as to operate as a resistor.

Hence, the second switching unit 200 forms a reception path, and the first shunt unit 300 transfers a residual signal from the transmission port 11 to the ground.

Here, the second shunt unit 400 operates as a capacitor to form a band pass filter in conjunction with the inductor L1.

Thus, because the second switching unit 200 is turned on in this example, a second radio frequency signal is smoothly transferred between the reception port 12 and the antenna port 10, and because the first switching unit 100 and the second shunt unit 400 are turned off, an unnecessary flow of the second radio frequency signal is cut off.

Also, because the first shunt unit 300 between the transmission port 11 and the ground is turned on in this example, the first radio frequency signal is prevented from being transferred to the reception port 12, and because the inductor L1 forms a band pass filter with the second shunt unit 400 being in an OFF state, insertion loss and isolation characteristics are improved, and voltage standing wave ratio (VSWR) reflection characteristics of a receiver, are potentially enhanced as well.

Figure 5:
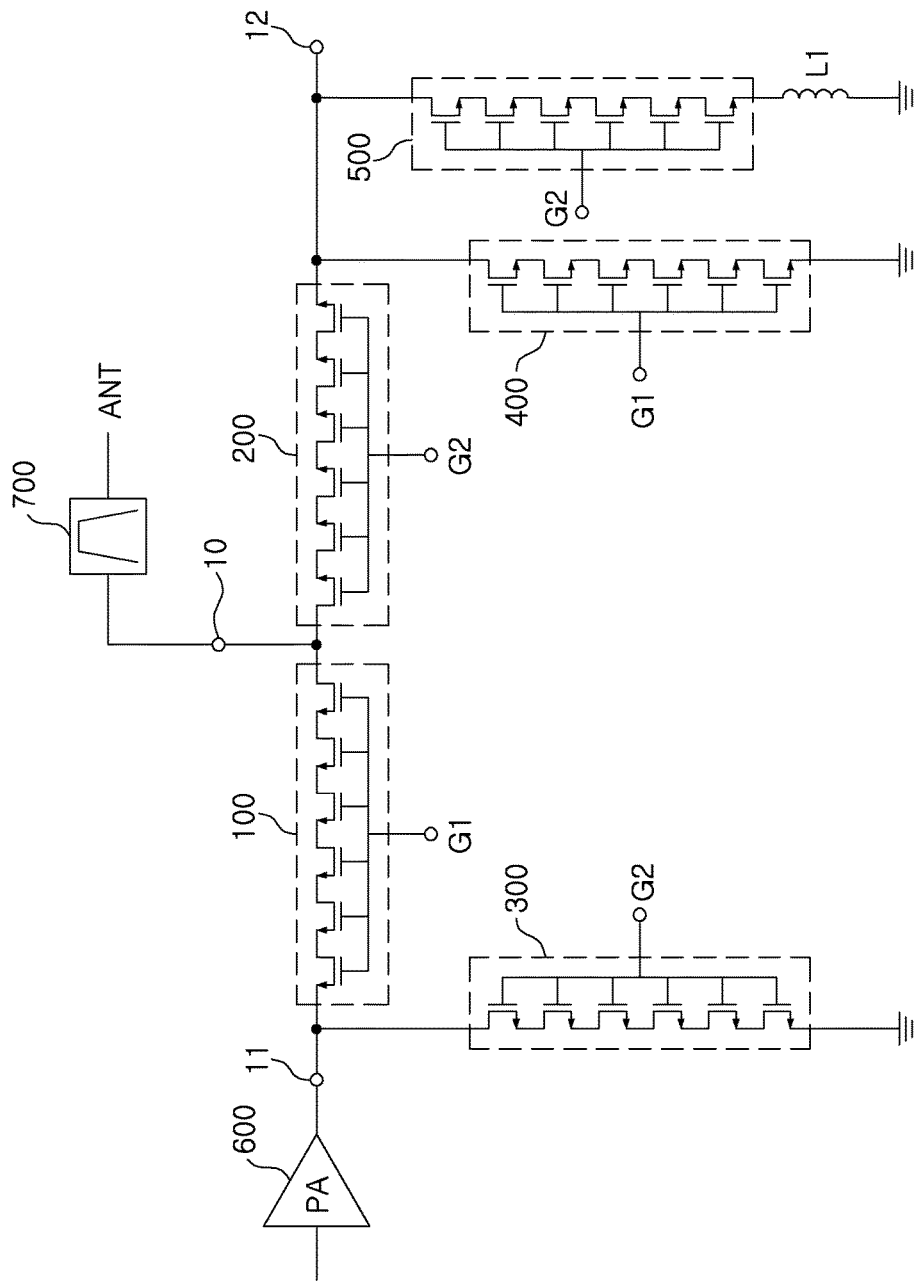
FIG. 5 is a circuit diagram illustrating a radio frequency switch according to an example.

FIG. 5 is a circuit diagram illustrating a radio frequency switch according to an example.

Referring to the example of FIG. 5, a radio frequency switch, according to an example, includes an amplifying unit, such as a power amplifier, 600 connected to the transmission port 11.

The amplifying unit 600 inputs an amplified transmission signal, as a first radio frequency signal, into the first switching unit 100 through the transmission port 11.

The first switching unit 100, when in an ON state, forms a transmission path to transfer the first radio frequency signal into the antenna port 10, and the first radio frequency signal is accordingly transmitted through the antenna connected to the antenna port 10.

Also, in an example, the antenna port 10 that transmits or receives the radio frequency signal is connected to a band pass filter 700 that removes interference of a band signal adjacent to the input/output radio frequency signal.

Figure 6:
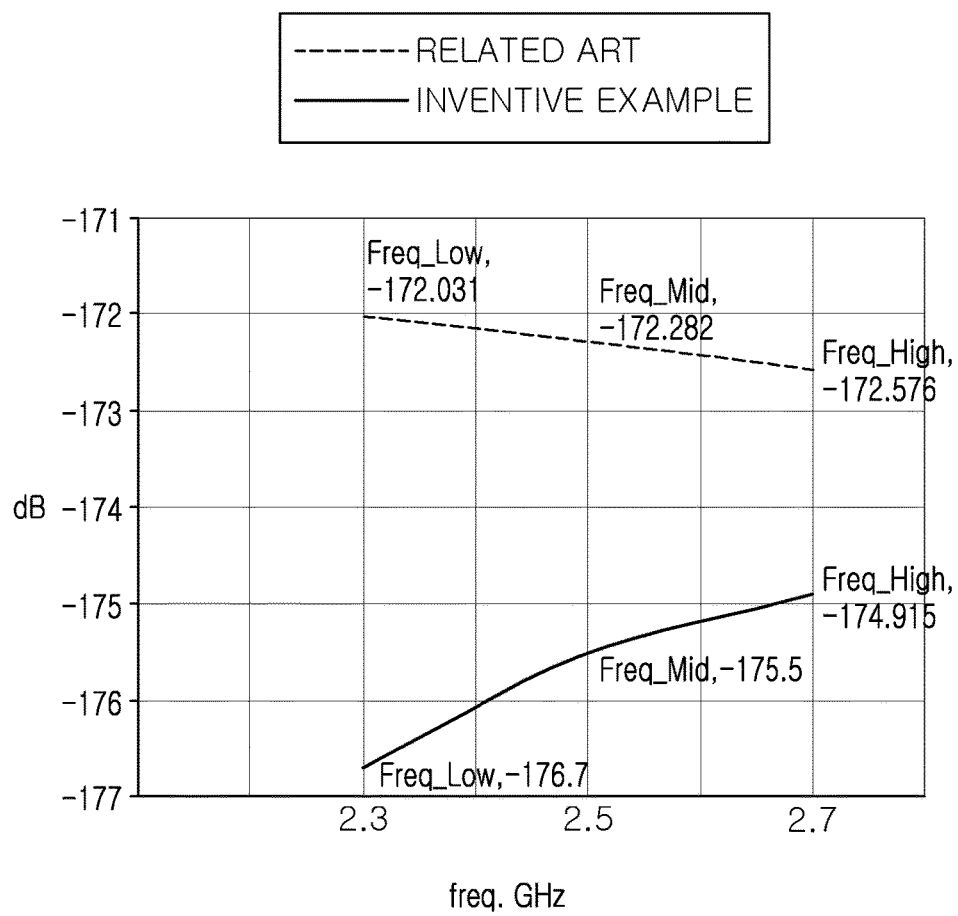
FIGS. 6 and 7A-7B are graphs illustrating simulation data of a radio frequency switch according to an example.

FIGS. 6 and 7 are graphs that illustrate simulation data of a radio frequency switch according to an example.

FIG. 6 is a graph that illustrates band noise characteristics. Referring to FIG. 3, in a transmission mode, the first switching unit 100 forms a transmission path, the second shunt unit 400 transfers a signal from the reception port 12 to the ground, and the third shunt unit 300 operates as a capacitor to form a notch filter with the inductor L1.

Referring to FIG. 6, noise is −175.5 dB at a frequency (Freq_Mid) of 2.5 GHz, and thus, it is observable that band noise characteristics of the receiver are improved.

Also, it is observable that band noise characteristics of a receiver are improved in a frequency band from about 2.3 GHz (Freq_Low) to about 2.7 GHz (Freq_High).

Figure 7A:
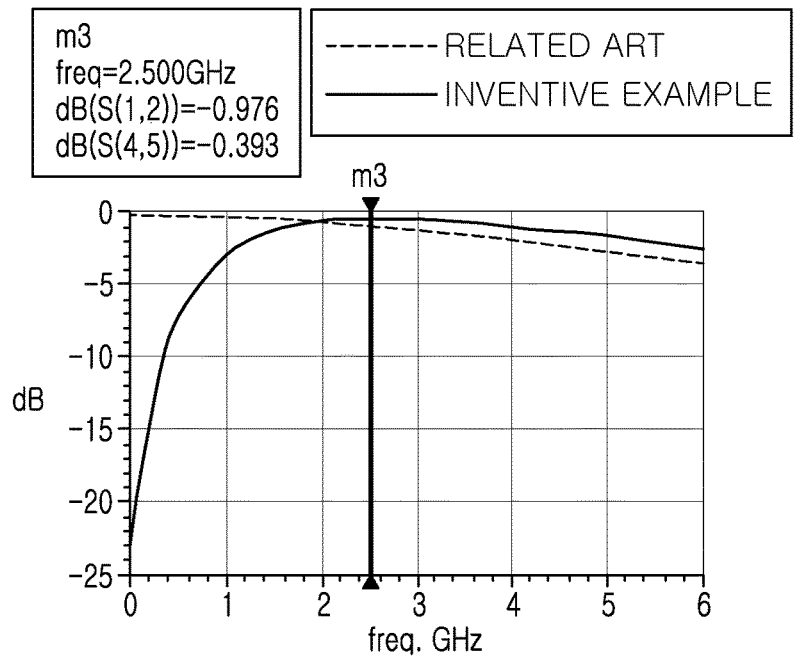

FIG. 7A is a graph illustrating passage characteristics. Referring to the example of FIG. 4, in a reception mode, the second switching unit 200 forms a reception path, the first shunt unit 100 transfers a signal of the transmission port 11 to the ground, and the second shunt unit 400 operates as a capacitor to form a band pass filter with the inductor.

Referring to FIG. 7A, it can be seen that passage characteristics of a receiver are improved by comparison to an alternative approach.

Figure 7B:
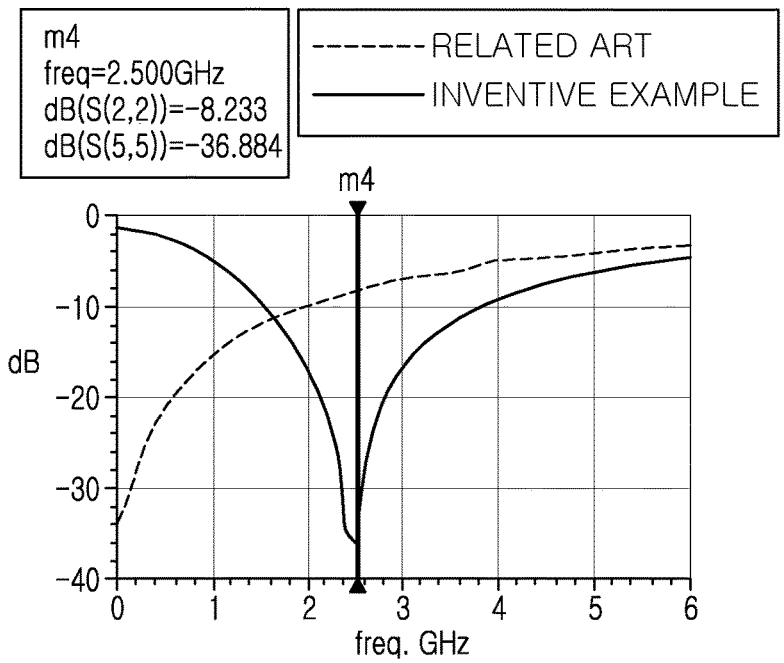

FIG. 7B is a graph illustrating reflection characteristics in case of the transmission mode with reference to the example of FIG. 3.

Referring to FIG. 7B, it can be seen that reflection characteristics are improved by the notch filter by comparison to an alternative approach.

As set forth above, according to the examples, since the radio frequency switch uses the shunt series switching units operating as a notch filter or a band pass filter, the radio frequency switch accordingly has low insertion loss and excellent isolation characteristics.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation, Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

The apparatuses, units, modules, devices, and other components illustrated in FIGS. 1-7B that perform the operations described herein with respect to FIGS. 1-7B are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-7B. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-7B that perform the operations described herein with respect to FIGS. 1-7B are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency switch comprising:
   a first switching circuit comprising first switching elements connected in series between an antenna port and a transmission port and operated by a first gate signal;
   a second switching circuit comprising second switching elements connected in series between the antenna port and a reception port and operated by a second gate signal;
   a first shunt circuit connected between the transmission port and a ground and operated by the second gate signal;
   a second shunt circuit connected between the reception port and the ground and operated by the first gate signal; and
   a third shunt circuit connected between the reception port and the other end of an inductor grounded at one end and operated by the second gate signal.

2. The radio frequency switch of claim 1, wherein in response to the first gate signal being a high level signal, the second gate signal is a low level signal, and
   in response to the first gate signal being a low level signal, the second gate signal is a high level signal.

3. The radio frequency switch of claim 1, wherein in response to the first switching circuit forming a transmission path, the second shunt circuit transfers a signal from the reception port to the ground.

4. The radio frequency switch of claim 1, wherein in response to the second switching circuit forming a reception path, the first shunt circuit transfers a signal from the transmission port to the ground.

5. The radio frequency switch of claim 1, wherein the first shunt circuit and the second shunt circuit comprise third switching elements and fourth switching elements, respectively.

6. The radio frequency switch of claim 5, wherein the third shunt circuit comprises fifth switching elements.

7. The radio frequency switch of claim 6, wherein each of the switching elements of the first to fifth switching elements is an N-channel field effect transistor (FET) or a P-channel FET.

8. The radio frequency switch of claim 1, wherein in response to the first switching circuit forming a transmission path, the third shunt circuit operates as a capacitor to form a notch filter with the inductor.

9. The radio frequency switch of claim 1, wherein in response to the second switching circuit forming a reception path, the second shunt circuit operates as a capacitor to form a band pass filter with the inductor.

10. The radio frequency switch of claim 1, further comprising an amplifying circuit connected to the transmission port and configured to output an amplified transmission signal.

11. A radio frequency switch comprising:
  a transmission port configured to receive a first radio frequency signal;
  a reception port configured to output a second radio frequency signal;
  an antenna port configured to transmit the first radio frequency signal or receive the second radio frequency signal;
  a first switching circuit comprising first switching elements connected to each other in series that form a path for the first radio frequency signal between the transmission port and the antenna port;
  a second switching circuit comprising second switching elements connected to each other in series that form a path of the second radio frequency signal between the reception port and the antenna port;
  a first shunt circuit comprising third switching elements connected to each other in series, and connected between the transmission port and a ground;
  a second shunt circuit comprising fourth switching elements connected to each other in series, and connected between the reception port and the ground; and
  a third shunt circuit located between the reception port and the other end of an inductor grounded at one end, and comprising fifth switching elements connected to each other in series.

12. The radio frequency switch of claim 11, wherein in response to the first switching circuit forming a path of the first radio frequency signal, the second shunt circuit forms a first bypass path from the reception port to the ground.

13. The radio frequency switch of claim 11, wherein in response to the second switching circuit forming a path of the second radio frequency signal, the first shunt circuit forms a second bypass path from the transmission port to the ground.

14. The radio frequency switch of claim 11, wherein in response to the first switching circuit forming the path of the first radio frequency signal, the fifth switching elements operate as capacitors to form a notch filter with the inductor.

15. The radio frequency switch of claim 11, wherein in response to the second switching circuit forming the path of the second radio frequency signal, the fourth switching elements operate as capacitors to form a band pass filter with the inductor.

16. The radio frequency switch of claim 11, further comprising a band pass filter connected to the antenna port and configured to cancel interference of a band signal adjacent to the first radio frequency signal or the second radio frequency signal.

* * * * *